(12) United States Patent
Wang et al.

(10) Patent No.: US 11,411,540 B2
(45) Date of Patent: Aug. 9, 2022

(54) POWER AMPLIFIER AND RADIO FREQUENCY DEVICE COMPRISING THE SAME

(71) Applicant: Telefonaktiebolaget LM Ericsson (publ), Stockholm (SE)

(72) Inventors: Zhancang Wang, Beijing (CN); Dan Yan, Beijing (CN)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/955,746

(22) PCT Filed: Dec. 19, 2017

(86) PCT No.: PCT/CN2017/117128
§ 371 (c)(1),
(2) Date: Jun. 18, 2020

(87) PCT Pub. No.: WO2019/119262
PCT Pub. Date: Jun. 27, 2019

(65) Prior Publication Data
US 2021/0013838 A1     Jan. 14, 2021

(51) Int. Cl.
*H03F 1/02*     (2006.01)
*H03F 3/21*     (2006.01)
(Continued)

(52) U.S. Cl.
CPC ............ *H03F 1/0288* (2013.01); *H03F 1/56* (2013.01); *H03F 3/211* (2013.01); *H04B 1/04* (2013.01);
(Continued)

(58) Field of Classification Search
None
See application file for complete search history.

(56) References Cited

U.S. PATENT DOCUMENTS

| | | | | |
|---|---|---|---|---|
| 5,903,820 A | * | 5/1999 | Hagstrom | H04B 1/40 455/82 |
| 6,262,629 B1 | * | 7/2001 | Stengel | H03F 1/0261 330/124 R |

(Continued)

FOREIGN PATENT DOCUMENTS

| | | |
|---|---|---|
| CN | 106571781 A | 4/2017 |
| EP | 3093987 A1 | 11/2016 |

(Continued)

OTHER PUBLICATIONS

International Search Report and the Written Opinion of the International Searching Authority, issued in corresponding International Application No. PCT/CN2017/117128, dated Sep. 19, 2018, 8 pages.

(Continued)

*Primary Examiner* — Pablo N Tran
(74) *Attorney, Agent, or Firm* — Christopher & Weisberg, P.A.

(57) ABSTRACT

A power amplifier is disclosed for amplifying an input signal and providing an amplified signal to a load at a junction node. The power amplifier comprises a splitter network, a carrier amplifier path and a peaking amplifier path. The peaking amplifier path comprises a first impedance transformer coupled between a peaking output matching network and the junction node to enhance the off-state impedance of the peaking amplifier. The carrier amplifier path comprises a second impedance transformer coupled between a carrier output matching network and the junction node.

17 Claims, 13 Drawing Sheets

(51) Int. Cl.
*H03F 1/56* (2006.01)
*H04B 1/04* (2006.01)
*H04B 1/40* (2015.01)
*H03F 1/42* (2006.01)
*H04W 88/08* (2009.01)

(52) U.S. Cl.
CPC ......... *H04B 1/40* (2013.01); *H03F 2200/222* (2013.01); *H03F 2200/387* (2013.01); *H03F 2200/451* (2013.01); *H04B 2001/0416* (2013.01); *H04W 88/08* (2013.01)

(56) References Cited

U.S. PATENT DOCUMENTS

| | | | | |
|---|---|---|---|---|
| 7,027,789 | B2* | 4/2006 | Ammar | H01L 23/66 330/289 |
| 7,127,269 | B2* | 10/2006 | Shih | H04B 1/005 455/552.1 |
| 7,167,688 | B2* | 1/2007 | Li | H04B 1/38 455/106 |
| 7,409,190 | B2* | 8/2008 | Murata | H05K 1/0243 455/76 |
| 7,521,995 | B1 | 4/2009 | Krvavac | |
| 8,326,344 | B2* | 12/2012 | Kemmochi | H05K 1/0243 455/550.1 |
| 8,467,738 | B2* | 6/2013 | Gorbachov | H04B 1/006 455/73 |
| 9,344,140 | B2* | 5/2016 | Reisner | H01L 29/737 |
| 10,511,265 | B2 | 12/2019 | Ai et al. | |
| 2006/0145757 | A1* | 7/2006 | Kim | H03F 3/602 330/124 R |
| 2009/0051438 | A1* | 2/2009 | Okubo | H03F 1/0288 330/286 |
| 2009/0285135 | A1* | 11/2009 | Rousu | H04B 1/0057 370/297 |
| 2012/0075018 | A1* | 3/2012 | Gong | H03F 3/24 330/124 R |
| 2013/0137381 | A1* | 5/2013 | Vassiliou | H04B 1/56 455/67.15 |
| 2014/0378182 | A1* | 12/2014 | Hara | H05K 1/0216 455/553.1 |
| 2015/0119104 | A1* | 4/2015 | Saji | H04W 88/10 455/553.1 |
| 2015/0133067 | A1* | 5/2015 | Chang | H04B 1/40 455/78 |
| 2015/0180428 | A1 | 6/2015 | Pham et al. | |
| 2017/0126181 | A1 | 5/2017 | Embar et al. | |
| 2019/0074799 | A1* | 3/2019 | Ai | H03F 3/21 |

FOREIGN PATENT DOCUMENTS

| | | |
|---|---|---|
| EP | 3247038 A1 | 11/2017 |
| WO | 2016065370 A1 | 4/2016 |

OTHER PUBLICATIONS

Jangheon Kim et al. "Advanced Design Methods of Doherty Amplifier for Wide Bandwidth, High Efficiency Base Station Power Amplifiers" DOI: 10.1109/EUMC.2005.1610088 • Source: IEEE Xplore,Conference: Microwave Conference, 2005 European, vol. 2, 4 pages.

Dong-Hee Jang et al. "Asymmetric Doherty Power Amplifier with Optimized Characteristics in Output Power Back-Off Range between 6 dB and 10 dB" Proceedings of the 40th European Microwave Conference, EuMA, Sep. 28-30, 2010, Paris, France, pp. 870-873.

Jangheon Kim et al. "Optimum Operation of Asymmetrical-Cells-Based Linear Doherty Power Amplifiers—Uneven Power Drive and Power Matching" IEEE Transactions on Microwave Theory and Techniques, vol. 53, No. 5, May 2005, pp. 1802-1809.

Ju-Young Lee et al. "A High Power Asymmetric Doherty Amplifier with Improved Linear Dynamic Range" IEEE, 2006, pp. 1348-1351.

Like Cen et al. "Optimization Design of Wideband Asymmetric Doherty Power Amplifiers with Different LDMOS Devices" 2011 IEEE Electrical Design of Advanced Packaging and Systems Symposium (EDAPS); 1-3; 2011, 3 pages.

Mohsin Mumtaz Tarar et al. "Asymmetric Doherty Power Amplifier at 2.2 GHz with 8.2 dB Output Power Back-Off" 2012 The 7th German Microwave Conference; 1-4; 2012, 4 pages.

Sang-Ho Kam et al. "Highly Linear and Efficient Unsymmetrical Inverted Doherty Power Amplifier Employing Phase Compensation" Proceedings of Asia-Pacific Microwave Conference 2010, WE3G-13, IEICE, pp. 406-409.

Yong-Sub Lee et al. "Unequal-Cells-Based GaN HEMT Doherty Amplifier With an Extended Efficiency Range" IEEE Microwave and Wireless Components Letters, vol. 18, No. 8, Aug. 2008, pp. 536-538.

Ericsson-Beijing "Temporary Data for B3 Doherty G296 GL5 180W+290W M1P Doherty PA EB/G296/D" Sumitomo Electric Device Innovations, Inc., Mar. 15, 2017, 5 pages.

Jingchu He et al. "A 500-W High Efficiency LDMOS Classical Three-way Doherty Amplifier for Base-Station Applications" 2016, IEEE MTT-S International Microwave Symposium (IMS), May 22, 2016, 4 pages.

Mengsu Yang et al. "A 1.8-2.3 GHz Broadband Doherty Power Amplifier with a Minimized Impedance Transformation Ratio" 2015 Asia-Pacific Microwave Conference (APMC), IEEE, vol. 1, Dec. 6, 2015, 3 pages.

* cited by examiner

Full Power Modulation:

Low Power Modulation:

| Main Path Impedance Transformation ratio | |
|---|---|
| Classic Doherty PA | An Embodiment of the Present disclosure |
| Power matching region | |
| 50 → 20.57 → 50 | 34.97 → 50 → 50 |
| Impedance transformation ratio = 2.43 | Impedance transformation ratio = 1.43 |
| Efficiency matching region | |
| 121.52 → 20.57 → 50 | 84.98 → 50 |
| Impedance transformation ratio = 5.91 | Impedance transformation ratio = 1.7 |

POWER AMPLIFIER AND RADIO FREQUENCY DEVICE COMPRISING THE SAME

CROSS REFERENCE TO RELATED APPLICATION(S)

This application is a 35 U.S.C. § 371 National Phase Entry Application from PCT/CN2017/117128, filed Dec. 19, 2017, designating the United States, the disclosure of which is incorporated herein by reference in its entirety.

TECHNICAL FIELD

Embodiments of the disclosure generally relate to the field of electronic components, and, more particularly, to a power amplifier and a radio frequency device comprising the same.

BACKGROUND

This section introduces aspects that may facilitate better understanding of the present disclosure. Accordingly, the statements of this section are to be read in this light and are not to be understood as admissions about what is in the prior art or what is not in the prior art.

In cellular base stations of 4G and beyond, advanced digital modulation schemes are used for high spectrum efficiency. The corresponding radio frequency (RF) signal exhibits a large peak to average power ratio (PAPR), which is amplified simultaneously in a power amplifier (PA). Therefore, the instantaneous transmitting power will vary extensively and fast. Due to the high PAPR stimulus, traditional RF PAs would suffer from rather low average efficiency.

One way for increasing the efficiency of an RF PA is to use Doherty architecture. For example, the classic Doherty PA may be used to enhance the efficiency for moderate PAPR signal, which creates a second efficiency peak point at 6 dB far away from the peak output power during back-offs. However, with ever increasing PAPR, it is difficult for the classic Doherty PA to maintain high efficiency with PAPR greater than 6 dB due to the limited Doherty region.

To achieve a Doherty region with greater than 6 dB high efficiency range, the Doherty architecture has been extended to inverted asymmetric Doherty variants which use different power levels of transistors and an inverted load modulation network. This may bring about simplified output matching configuration and realize more compact design from the drain terminal to the final output. One parameter of an inverted asymmetric Doherty PA that may affect the power added efficiency (PAE) is peaking amplifier off-state impedance. It refers to the impedance looking back into the peaking amplifier, including the output matching network, when the peaking amplifier is in an off state. The ideal off-state impedance should be relatively high so as not to load the carrier amplifier during a low input power condition where the peaking amplifier is turned off.

Therefore, it would be desirable to provide a Doherty PA with enhanced peaking amplifier off-state impedance.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide a power amplifier with enhanced peaking off-state impedance.

According to one aspect of the disclosure, there is provided a power amplifier. The power amplifier comprises a splitter network, a carrier amplifier path and a peaking amplifier path. The splitter network is configured to split an input signal into a carrier input signal and a peaking input signal. The carrier amplifier path comprises at least a carrier amplifier configured to amplify the carrier input signal and carrier input and output matching networks. The peaking amplifier path is combined at a junction node with the carrier amplifier path and comprises at least a peaking amplifier configured to amplify the peaking input signal and peaking input and output matching networks. The peaking amplifier path further comprises a first impedance transformer coupled between an output of the peaking output matching network and the junction node to enhance the off-state impedance of the peaking amplifier. The carrier amplifier path further comprises a second impedance transformer coupled between an output of the carrier output matching network and the junction node.

In an embodiment of the disclosure, the saturation output power ratio between the peaking amplifier and the carrier amplifier is equal to or greater than one.

In an embodiment of the disclosure, the first impedance transformer is configured to transform a first output impedance seen from the output of the peaking output matching network into a second output impedance seen from an output of the first impedance transformer. The second output impedance is higher than the first output impedance. The second impedance transformer is configured to transform a third output impedance seen from the output of the carrier output matching network into a fourth output impedance seen from an output of the second impedance transformer. The parallel impedance of the second and fourth output impedances equals to a junction node impedance of the power amplifier in both a high-power mode where both the carrier and peaking amplifiers turn on and a low-power mode where only the carrier amplifier turns on. The junction node impedance equals to the system load impedance of the power amplifier.

In an embodiment of the disclosure, when the power amplifier operates in the low-power mode where the peaking amplifier is turned off, the second output impedance equals to the first output impedance multiplied by at least a product of voltage standing wave ratio (VSWR) and r, where r is the saturation output power ratio between the peaking amplifier and the carrier amplifier, and VSWR=r+1.

In an embodiment of the disclosure, when the power amplifier operates in the high-power mode, the first output impedance equals to $Z_0/r$, the second output impedance equals to $Z_0 * VSWR$, the third output impedance equals to $Z_0$, and the fourth output impedance equals to $Z_0 * VSWR * r$, where $Z_0$ equals to $Z_L/r$ and $Z_L$ is the system impedance of the power amplifier. When the power amplifier operates in the low-power mode, the third output impedance equals to $Z_0 * VSWR$, and the fourth output impedance equals to $Z_0 * r$.

In an embodiment of the disclosure, the carrier amplifier path is configured to have low impedance transformation ratios in both the high-power mode and the power mode to expand bandwith.

In an embodiment of the disclosure, the splitter network is configured to split the power of the input signal in an imbalanced manner to assign more power to the peaking amplifier path and assign less power to the carrier amplifier path.

In an embodiment of the disclosure, the splitter network is one of: an in-phase power divider, a directional coupler, and a hybrid coupler.

In an embodiment of the disclosure, an offset line is disposed either in the carrier amplifier path before the carrier input matching network, or in the peaking amplifier path before the peaking input matching network.

In an embodiment of the disclosure, the first impedance transformer is disposed partially within the peaking output matching network.

According to another aspect of the disclosure, there is provided a radio unit (RU) comprising the power amplifier according to the above aspect.

In an embodiment of the disclosure, the RU is used for a base station or a terminal device.

According to another aspect of the disclosure, there is provided a base station. The base station comprises a processor, a memory, the power amplifier according to the above aspect and an antenna unit. The memory contains instructions executable by the processor to implement functions of the base station. The power amplifier is configured to amplify an RF signal. The antenna unit is configured to transmit the amplified RF signal.

According to another aspect of the disclosure, there is provided a terminal device. The terminal device comprises a processor, a memory, the power amplifier according to the above aspect and an antenna unit. The memory contains instructions executable by the processor to implement functions of the terminal device. The power amplifier is configured to amplify an RF signal. The antenna unit is configured to transmit the amplified RF signal.

According to some embodiment(s) of the disclosure, due to enhanced peaking off-state impedance, the power leakage from the carrier amplifier to the peaking amplifier path can be reduced. Thereby, the carrier amplifier back-off efficiency can be enhanced.

BRIEF DESCRIPTION OF THE DRAWINGS

These and other objects, features and advantages of the disclosure will become apparent from the following detailed description of illustrative embodiments thereof, which are to be read in connection with the accompanying drawings.

DETAILED DESCRIPTION

For the purpose of explanation, details are set forth in the following description to provide a thorough understanding of the embodiments disclosed. It is apparent, however, to those skilled in the art that the embodiments may be implemented without these specific details or with an equivalent arrangement.

As mentioned above, peaking amplifier off-state impedance is an important parameter that can affect the power added efficiency (PAE) of an inverted asymmetric Doherty PA. However, the amplifier topologies in current technologies can only maintain a moderate peaking amplifier off-state impedance for high power applications, because their traditional configurations limit further enhancing of the peaking off-state impedance. Due to a lower than desired peaking path off-state impedance, the carrier/main amplifier back-off efficiency may be compromised.

Figure 1:
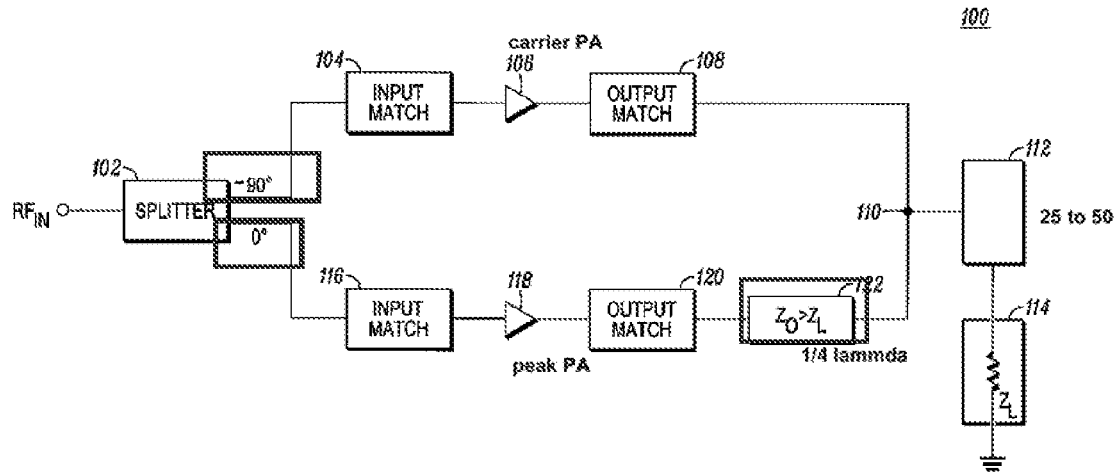
FIG. 1 is a diagram showing an existing Doherty PA.

Specifically, for the existing solution shown in FIG. 1, to achieve enhanced peaking off-state impedance, the inverted Doherty PA 100 requires the impedance value Zo of the impedance inverter 122 to be greater than the load impedance $Z_L$. However, using high characteristic impedance Zo for the impedance inverter 122 may bring about the matching difficulty for the main/carrier amplifier 106 in both output matching optimizations for full power and back-off power modes.

Figure 2:
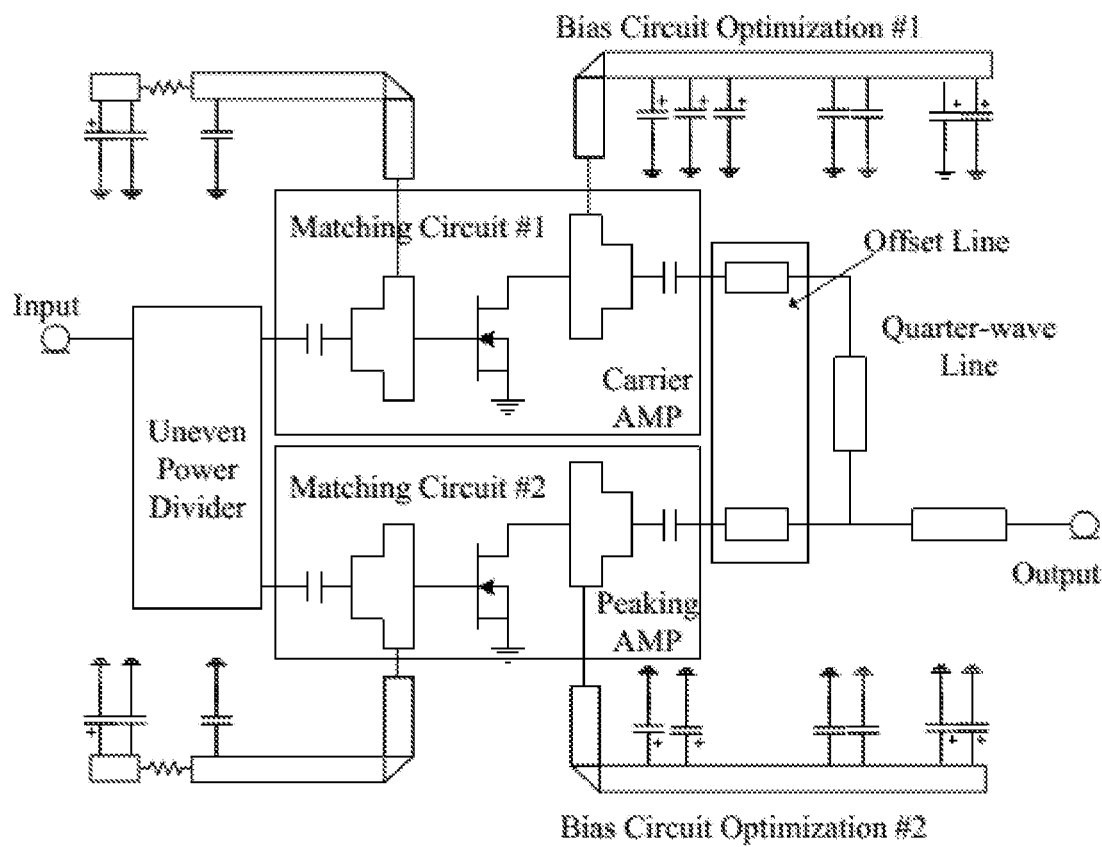
FIG. 2 is a diagram showing an existing Doherty PA.

For the existing solution shown in FIG. 2, more power is split and driven into the peaking amplifier for power matching, which can help the peaking amplifier to realize full power. However, the more power is assigned to the peaking path, the more difficult it is to realize high peaking off-state impedance. For example, for high power Gallium Nitride (GaN) high electron mobility transistor (HEMT) PA scenario, the overall Doherty gain, amplitude-to-amplitude conversion (AM-AM) response and peaking off-state impedance would be degraded. In practical design for commercial products in base stations with GaN HEMTs, it may bring about difficulties to meet the transducer gain and high efficiency for main/carrier amplifier back-offs.

Figure 3:
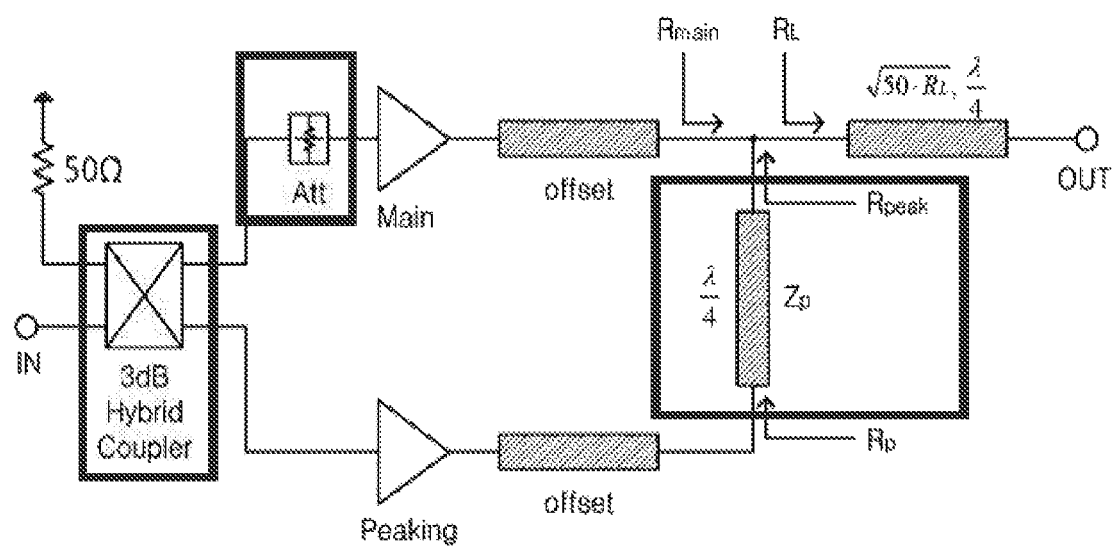
FIG. 3 is a diagram showing an existing Doherty PA.

For the existing solution shown in FIG. 3, a 3 dB hybrid coupler plus an attenuator are used in the main/carrier path, which may help to improve amplitude-to-amplitude conversion (AM-AM) response and make the peaking amplifier reach its full power. However, it may reduce the overall Doherty gain too much by introducing the attenuation in the main/carrier path. Also, the peaking off-state impedance may be degraded due to more input power for the peaking amplifier. To compensate the impact of the uneven power splitting, the input/gate bias of the peaking amplifier may need to be very negative bias in GaN HEMT PAs, resulting in that the AM-AM response would be quite difficult to be linearized or accepted in product specifications.

The present disclosure proposes an improved solution for Doherty PA with high peaking off-state impedance. Hereinafter, the solution will be described in detail with reference to FIGS. 4-12.

Figure 4A:
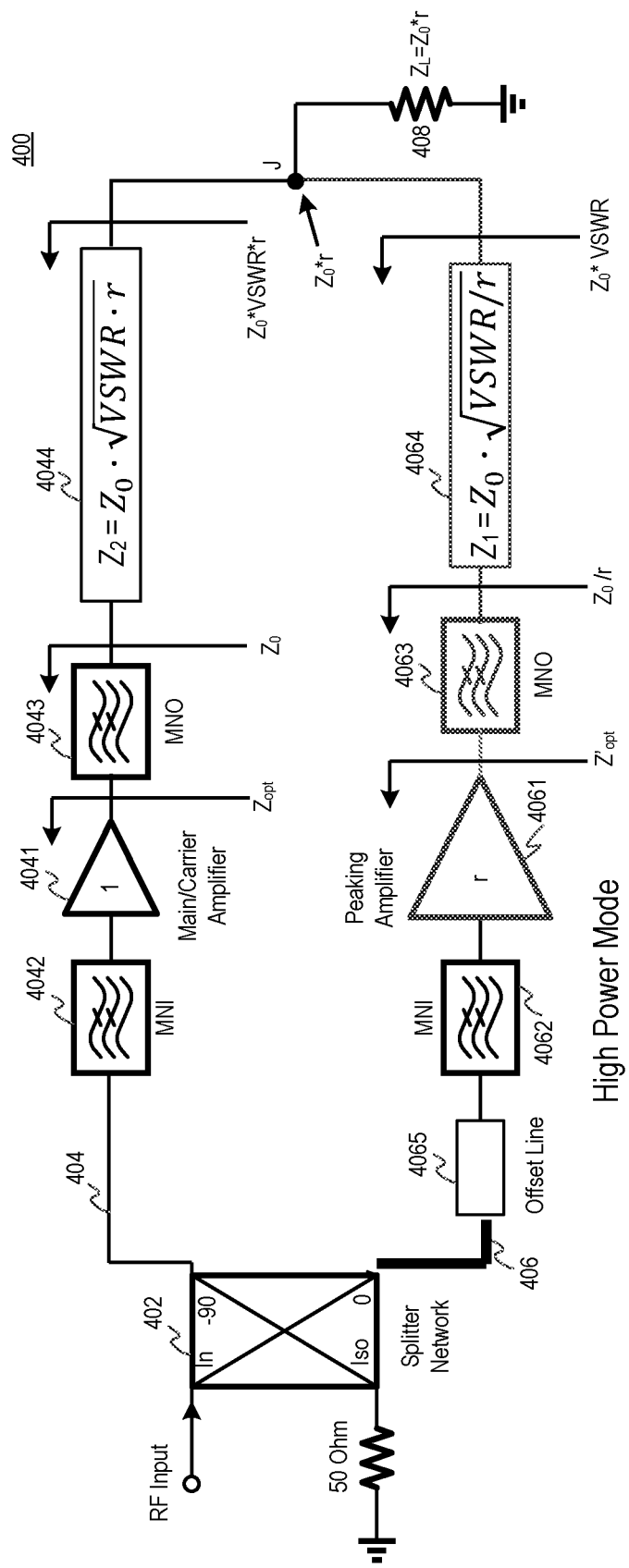
FIGS. 4A-4B are schematic diagrams showing a Doherty PA according to an embodiment of the disclosure under different operation modes.
Figure 4B:
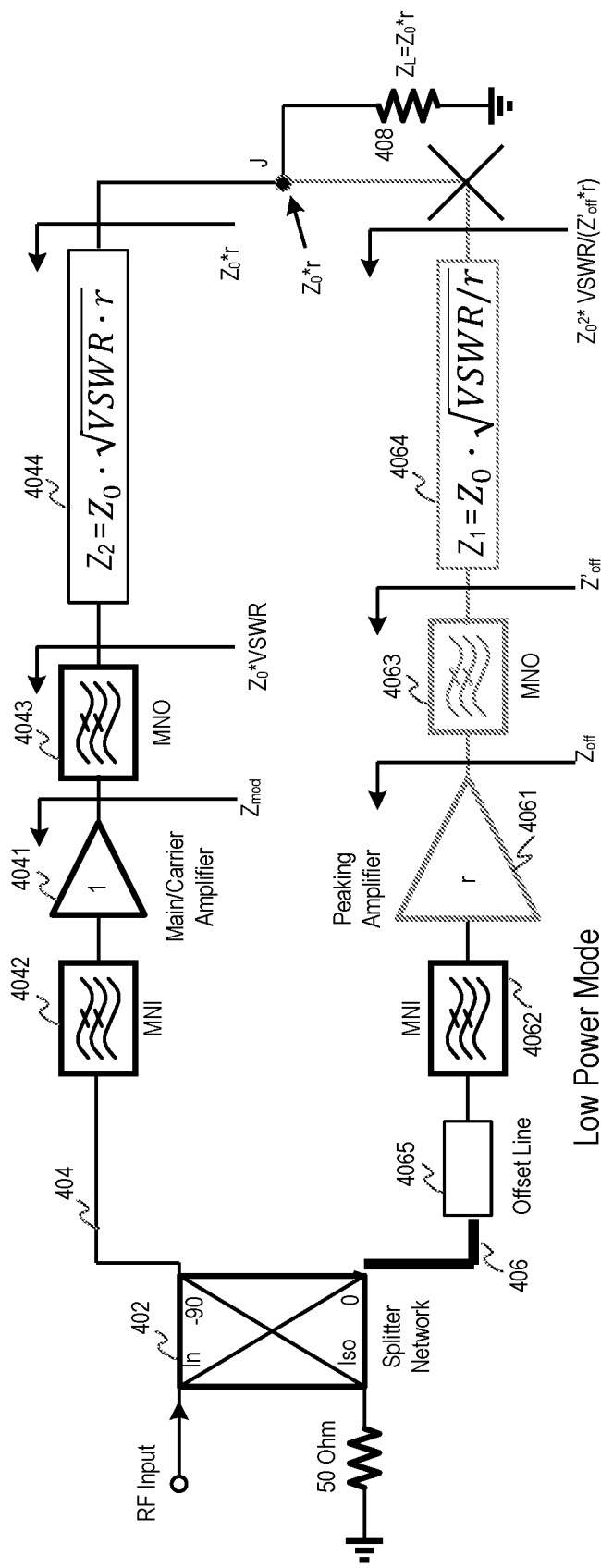

FIGS. 4A-4B are schematic diagrams showing a Doherty PA according to an embodiment of the disclosure under different operation modes. As shown, the Doherty PA 400 comprises a splitter network 402, a carrier amplifier path 404, a peaking amplifier path 406 and a load 408. The carrier amplifier path 404 and the peaking amplifier path 406 are connected respectively to the two output ports of the splitter network 402 and are combined at a junction node J. The load 408 is coupled to the junction node J and has the system impedance $Z_L$ which is typically 50 Ohm.

The carrier amplifier path 404 comprises a carrier input matching network 4042, a carrier amplifier 4041, a carrier output matching network 4043, a second impedance transformer 4044 connected in series in the described order. The peaking amplifier path 406 comprises an offset line 4065, a peaking input matching network 4062, a peaking amplifier 4061, a peaking output matching network 4063 and a first impedance transformer 4064 connected in series in the described order.

The splitter network 402 is configured to split an input signal into a carrier input signal and a peaking input signal. It can split the power of the input signal in an imbalanced manner to assign more power to the peaking amplifier path 406 and assign less power to the carrier amplifier path 404. That is, the carrier amplifier 4041 and the peaking amplifier 4061 deliver unequal amount of output power at the maximum drive condition. For example, the splitter network 402 may split the input power into 1:N ratio between the carrier amplifier path and the peaking amplifier path, where N is an integer greater than one.

As a first example, the splitter network 402 may be a hybrid coupler that splits the input signal such that the carrier input signal and the peaking input signal has a 90-degree phase difference. As a second example, the splitter network 402 may be a directional coupler that splits the input signal such that the carrier input signal and the peaking input signal has an equalized/arbitrary phase difference. As a third example, the splitter network 402 may be an in-phase power divider that splits the input signal such that the carrier input signal and the peaking input signal has a phase difference of zero degree. In the second and third examples, compared to the first example having a 90-degree phase difference, the offset line for compensating the phase difference can be made shorter to achieve a more compact size.

The carrier amplifier 4041 is configured to amplify the carrier input signal. It is turned on in both a high-power mode (also referred to as full power mode) and a low-power mode (also referred to as back-off power mode). As an exemplary example, the carrier amplifier 4041 may be implemented by using class –E, –F, or –F$^{-1}$ mode amplifier such as GaN HEMT. It should be noted that the present disclosure is not limited to this example and any other suitable transistor may be used instead.

The carrier input matching network 4042 is configured to match the input impedance of the carrier amplifier 4041 to the system impedance of the Doherty PA 400. The system impedance may typically take the value of 50 Ohm. The carrier output matching network 4043 is configured to match the output impedance of the carrier amplifier 4041 to two corresponding impedances for the high-power mode and the low-power mode respectively.

The peaking amplifier 4061 is configured to amplify the peaking input signal. It is turned on in the high-power mode and is turned off in the low-power mode. The saturation output power ratio (denoted as r) between the peaking amplifier 4061 and the carrier amplifier 4041 is equal to or greater than one, that is, r≥1. In other words, the Doherty PA 400 is an asymmetric Doherty PA. Similar to the carrier amplifier 4041, the peaking amplifier 4061 may be implemented by using, but not limited to, class –E, –F, or –F$^{-1}$ mode amplifier such as GaN HEMT.

The peaking input matching network 4062 is configured to match the input impedance of the peaking amplifier 4061 to the system impedance of the Doherty PA 400. The peaking output matching network 4063 is configured to match the output impedance of the peaking amplifier 4061 to two corresponding impedances for the high-power mode and the low-power mode respectively.

The offset line 4065 is configured to compensate the phase difference between the carrier amplifier path 404 and the peaking amplifier path 406 to guarantee the phase synchronization during combination at the junction node J. Alternatively, instead of being disposed in only the peaking amplifier path 406, an offset line may be disposed in only the carrier amplifier path 404 before the carrier input matching network 4042.

The first impedance transformer 4064 is configured to transform a first output impedance (denoted as $Z_{out1}$) seen from the output of the peaking output matching network 4063 into a second output impedance (denoted as $Z_{out2}$) that is seen from an output of the first impedance transformer 4064 and higher than $Z_{out1}$. The first impedance transformer 4064 may be implemented as a quarter wave transmission line. Optionally, the first impedance transformer 4064 may be disposed partially within (or partially absorbed by) the peaking output matching network 4063 to minimize the size of the Doherty PA 400.

The second impedance transformer 4044 is configured to transform a third output impedance (denoted as $Z_{out3}$) seen from the output of the carrier output matching network 4043 into a fourth output impedance (denoted as $Z_{out4}$) seen from an output of the second impedance transformer 4044. The second impedance transformer 4044 may be implemented as a quarter wave transmission line.

The parallel impedance of $Z_{out2}$ and $Z_{out4}$ equals to a junction node impedance (denoted as $Z_J$) of the Doherty PA 400 in both the high-power mode and the low-power mode. In this way, the impedance $Z_{out2}$ happening in the peaking amplifier path 406 can be accommodated by the second impedance transformer 4044. Furthermore, the junction node impedance $Z_J$ equals to the system impedance (denoted as $Z_L$) which may typically take the value of 50 Ohm. This can make the design compact and save an additional impedance transformer for transforming the junction node impedance into the system impedance.

For example, in the high-power mode shown in FIG. 4A, it is assumed that the output impedance of the peaking amplifier 4061 is denoted as $Z'_{opt}$, and $Z_{out1}$ from the peaking output matching network 4063 is denoted as $Z_0/r$, where $Z_0$ equals to $Z_L/r$. It is also assumed that the output impedance of the carrier amplifier 4041 is denoted as $Z_{opt}$, and $Z_{out3}$ from the carrier output matching network 4043 is denoted as $Z_0$.

Then, the characteristic impedance (denoted as $Z_1$) of the first impedance transformer 4064 can be set as:

$Z_1 = Z_0 \sqrt{VSWR/r}$, where the VSWR value is voltage standing wave ratio and VSWR=r+1. Thus, according to the impedance transformation formula of quarter wave transmission line, $Z_{out2}$ from the first impedance transformer 4064 can be calculated as:

$$Z_{out2} = \frac{Z_1^2}{Z_{out1}} = Z_0 \cdot VSWR.$$

To accommodate the impedance $Z_{out2}$ happening in the peaking amplifier path 406, the characteristic impedance (denoted as $Z_2$) of the second impedance transformer 4044 can be set as:

$$Z_2 = Z_0 \cdot \sqrt{VSWR \cdot r}.$$

Thus, $Z_{out4}$ from the second impedance transformer 4044 can be calculated as:

$$Z_{out4} = \frac{Z_2^2}{Z_{out3}} = Z_0 \cdot VSWR \cdot r.$$

Then, the parallel impedance (denoted as $Z_p$) of $Z_{out2}$ and $Z_{out4}$ can be calculated as:

$$Z_p = \frac{Z_{out2} \cdot Z_{out4}}{Z_{out2} + Z_{out4}} = \frac{Z_0 \cdot VSWR \cdot r}{r+1} = Z_0 \cdot r.$$

In the low-power mode shown in FIG. 4B, it is assumed that the output impedance (denoted as $Z_{off}$) of the peaking amplifier 4061 is very small, and the output impedance of the carrier amplifier 4041 is denoted as $Z_{mod}$. Thus, $Z_{out1}$ (or $Z'_{off}$ in FIG. 4B) is also very small, and $Z_{out3}$ from the carrier output matching network 4043 can be determined as $Z_0 * VSWR$. That is, the Doherty PA 400 is a normal or non-inverted Doherty PA instead of an inverted Doherty PA.

Then, $Z_{out2}$ from the first impedance transformer 4064 can be calculated as:

$$Z_{out2} = \frac{Z_1^2}{Z_{out1}} = \frac{Z_0^2 \cdot VSWR}{r \cdot Z'_{off}} = \left(\frac{Z_0}{r}\right)^2 \cdot \frac{VSWR \cdot r}{Z'_{off}}.$$

Since $Z'_{off}$ is very small, $Z_{out2}$ is very large. This indicates that the peaking off-state impedance of this embodiment in the low-power mode is at least $VSWR*r$ times higher than the value $(Z_0/r)$ of a classic Doherty counterpart in current technologies.

Since r is equal to or greater than one ($r \geq 1$), VSWR is equal to or greater than two ($VSWR \geq 2$), which indicates an enhancement of at least two times. Meanwhile, $Z_{out4}$ can be calculated as:

$$Z_{out4} = \frac{Z_2^2}{Z_{out3}} = Z_0 \cdot r.$$

Since $Z_{out2}$ is very large, the parallel impedance $Z_p$ of $Z_{out2}$ and $Z_{out4}$ still equals to $Z_0 \cdot r$.

Due to the above transformation, the power leakage from the carrier/main amplifier to the peaking amplifier path can be reduced due to higher peaking off-state impedance. Hence, the actual efficiency of the carrier/main amplifier is more approaching to the value in ideal case such that the carrier/main amplifier efficiency can be enhanced in practice. Thus, although more input power assigned into the peaking amplifier may degrade peaking off-state impedance, a novel modulation network is provided in this embodiment to secure high peaking off-state impedance to enhance main/carrier amplifier back off efficiency.

Figure 5A:
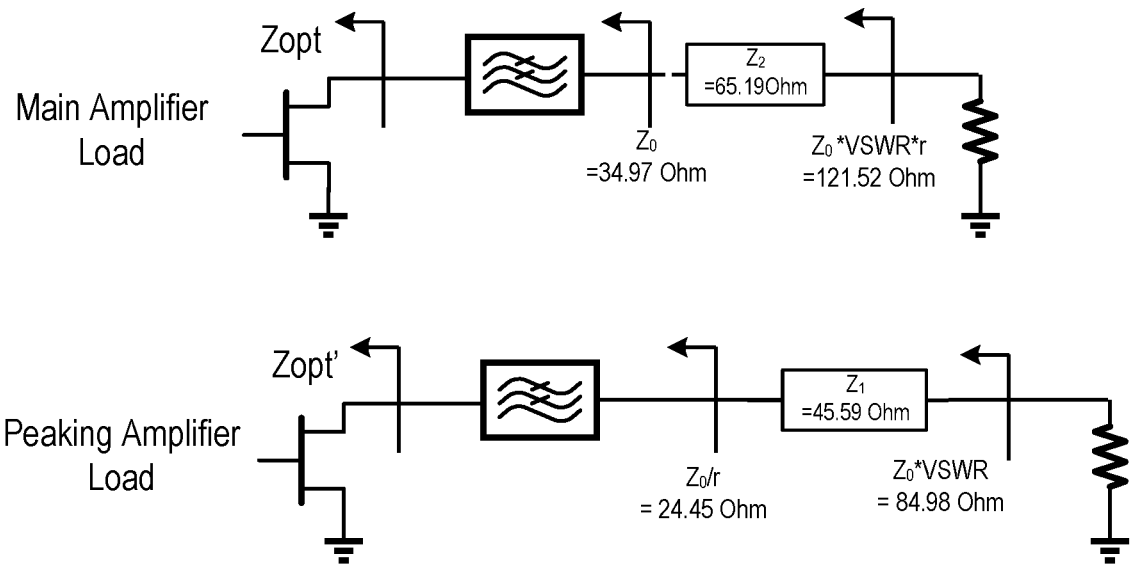
FIGS. 5A-5B show a design example for the load modulation network shown in FIGS. 4A-4B.
Figure 5B:
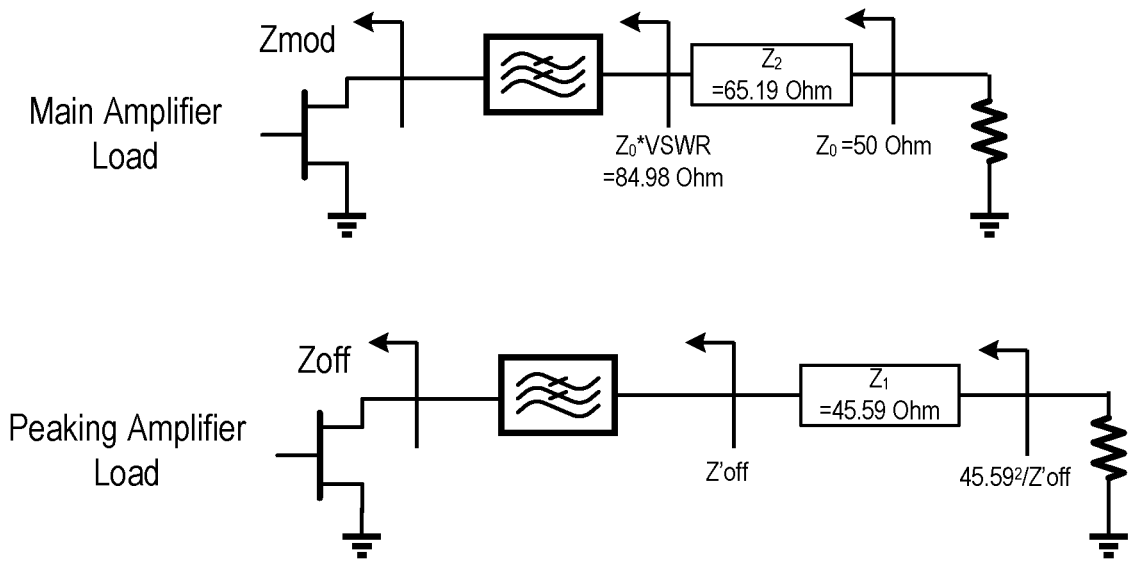

FIGS. 5A-5B show a design example for the load modulation network shown in FIGS. 4A-4B. In this example, the parameters are selected as: $r=1.43$, $VSWR=2.43$, and $Z_0=34.97$ Ohm. Then, in the high-power mode shown in FIG. 5A, $Z_1$ can be set as 45.59 Ohm, which can transform $Z_{out1}$ (24.45 Ohm) to $Z_{out2}$ (84.98 Ohm). $Z_2$ can be set as 65.19 Ohm, which can transform $Z_{out3}$ (34.97 Ohm) to $Z_{out4}$ (121.52 Ohm). The parallel impedance of $Z_{out2}$ and $Z_{out4}$ can be obtained as $Z_p = Z_L = 50$ Ohm.

In the low-power mode shown in FIG. 5B, $Z_1$ (45.59 Ohm) can transform $Z_{out1}$ (or $Z'_{off}$ approaching to zero) to $Z_{out2}$ ($45.59^2/Z'_{off}$ approaching to infinity). $Z_2$ (65.19 Ohm) can transform $Z_{out3}$ (84.98 Ohm) to $Z_{out4}$ (50 Ohm). The parallel impedance of $Z_{out2}$ and $Z_{out4}$ can still equal to $Z_L$.

Thus, it can be seen that the relation presented in FIGS. 4A-4B can make it much easier to match $Z_{mod}$ and $Z_{opt}$ for the main/carrier amplifier and match $Z_{off}$ and $Z'_{opt}$ for the peaking amplifier simultaneously in a single output matching network. Better matching means less insertion loss of the output matching network.

Figure 6:
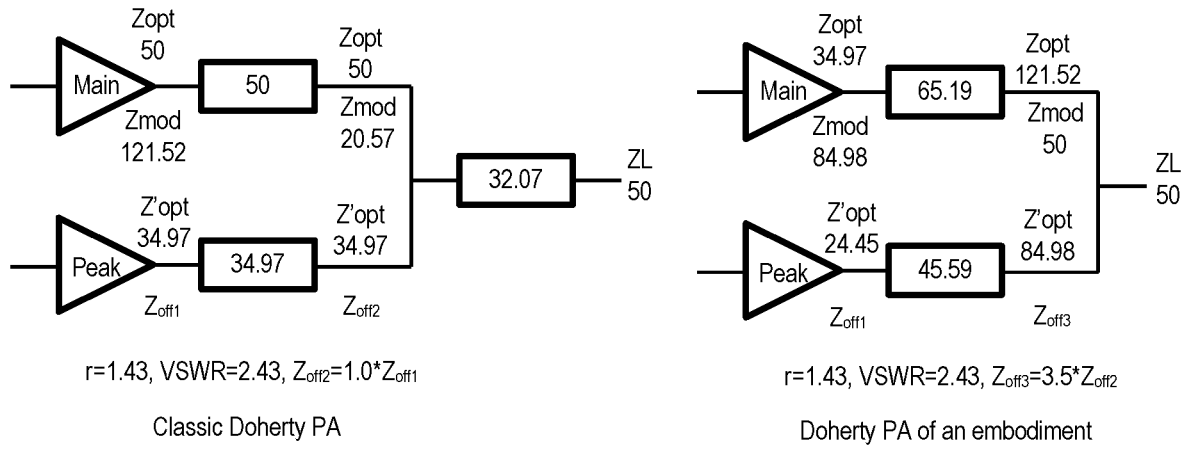
FIG. 6 shows the improved impedance transformation ratios of an embodiment of the disclosure compared with a classic Doherty PA.

FIG. 6 shows the improved impedance transformation ratios of an embodiment of the disclosure compared with a classic Doherty PA. As shown, assume r equals to 1.43 and VSWR equals to 2.43, which is the same as FIGS. 5A-5B. Then, the off-state impedance of the peaking amplifier in this embodiment can be enhanced by 3.5(=2.43*1.43) times compared with the classic Doherty PA. Furthermore, in the power matching region where both the carrier and peaking amplifiers turn on, the impedance transformation ratio is 2.43 in the classic Doherty PA, while the impedance transformation ratio is 1.43 in the embodiment shown in FIGS. 5A-5B. In the efficiency matching region where only the carrier amplifier turns on, the impedance transformation ratio is 5.91 in the classic Doherty PA, while the impedance transformation ratio is 1.7 in the embodiment shown in FIGS. 5A-5B. Thus, the enhancement of the off-state impedance can also facilitate broadband performance with a reduced impedance transformation ratio.

Figure 7:
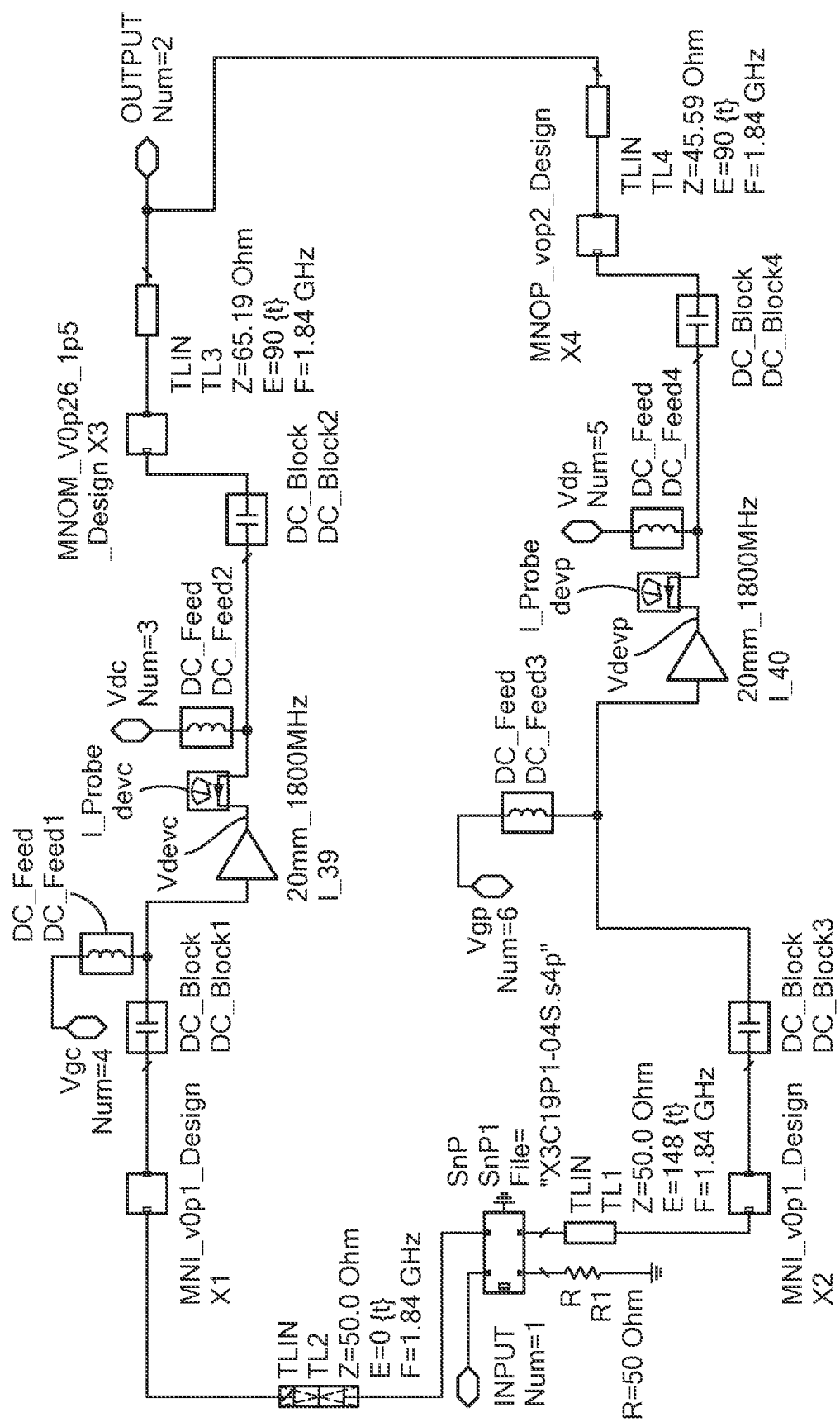
FIG. 7 shows a simulated design example for the Doherty PA shown in FIGS. 4A-4B.

To evaluate the effect of the embodiment shown in FIGS. 4A-4B, simulation was performed in B3 (1805~1880 MHz) frequency band. FIG. 7 is the schematic circuit diagram used in this simulation. Specifically, a PCB with the model number "Rogers TC350 20 mil" and GaN HEMT devices were used. The uneven input splitting was implemented by a 4 dB directional coupler with more power assigned to the peaking amplifier to reduce the insufficient peaking current issue.

Figure 8:
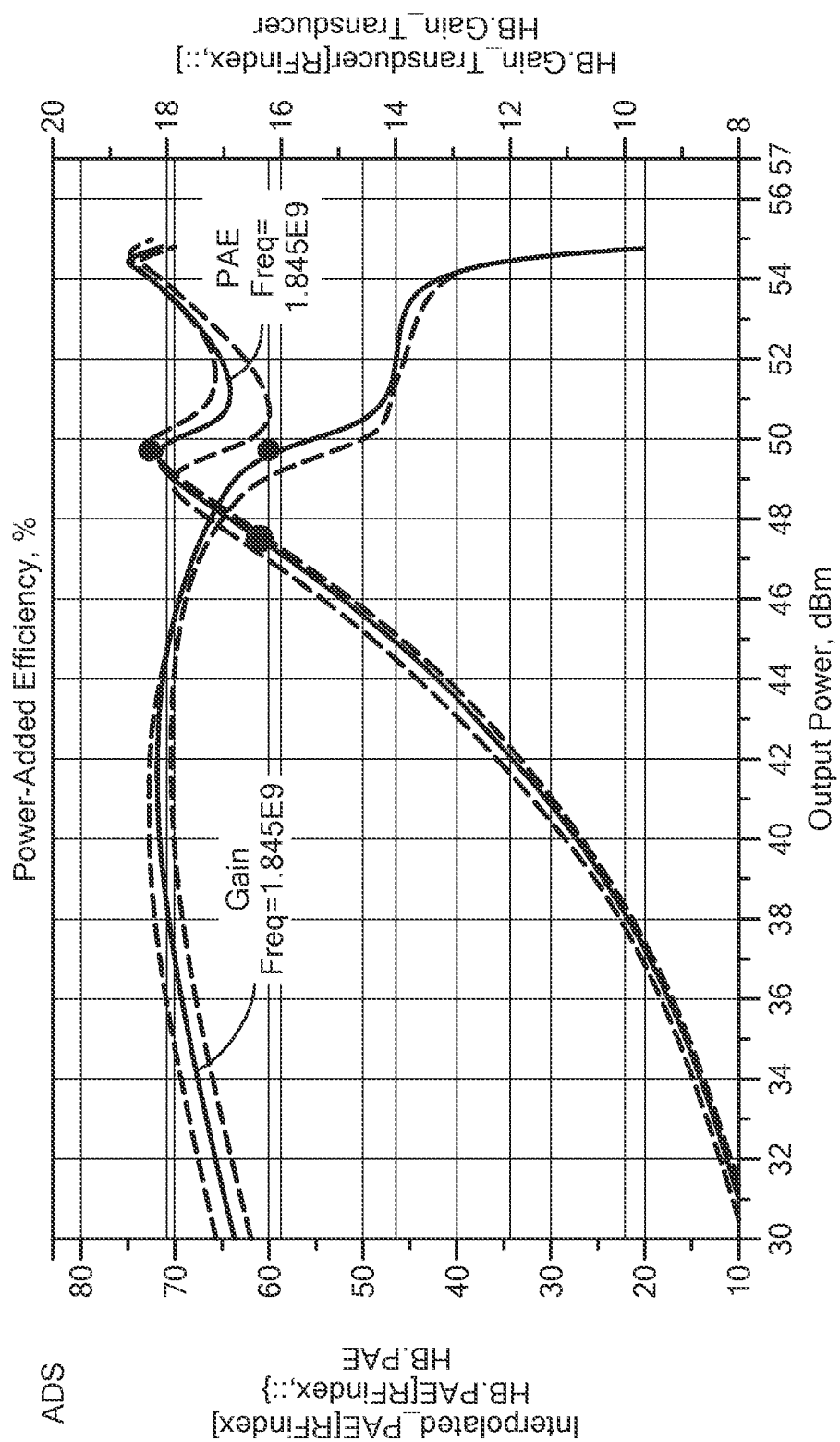
FIG. 8 shows the transducer gain and PAE of the simulated design example.

FIG. 8 shows the simulation results of the transducer gain and PAE for the design example. As shown, each of the transducer gain and PAE has basically similar behaviors over the B3 (1805~1880 MHz) frequency band. Thus, only the behavior at the mid-frequency (1845 MHz) is indicated in FIG. 8. It can be seen that even with a back-off of about 7.8 dB, the PAE is still above 60%.

Figure 9:
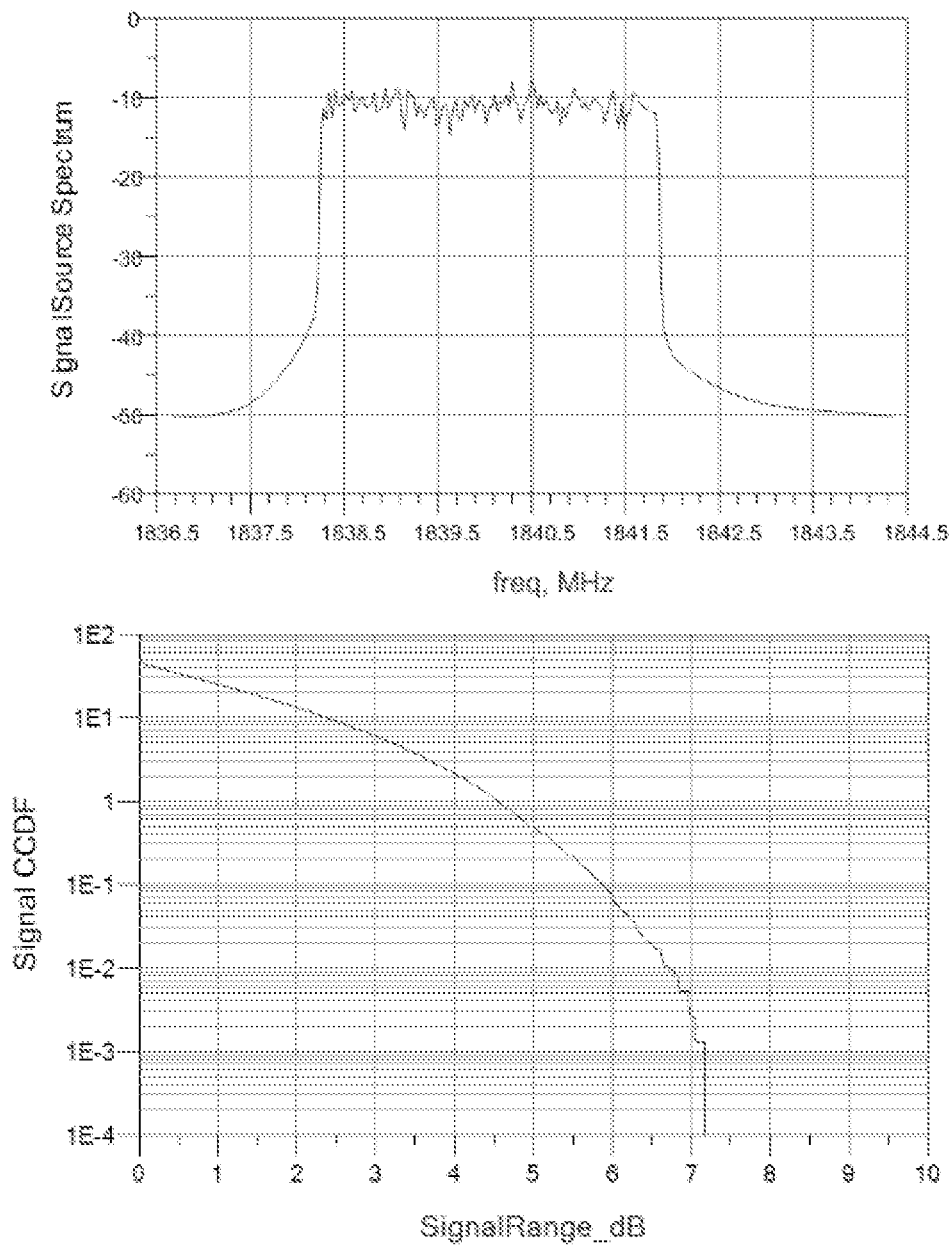
FIG. 9 shows the characteristics of an input signal with high PAPR.

FIG. 9 shows the characteristics of an input signal with high PAPR for simulation. The input signal is a clipped long-term evolution (LTE) 5 MHz signal with PAPR as 7.3 dB. The upper curve in FIG. 9 shows the spectrum over the operating frequency band. The lower curve in FIG. 9 shows the complementary cumulative distribution function (CCDF) as a function of the signal range.

Figure 10A:
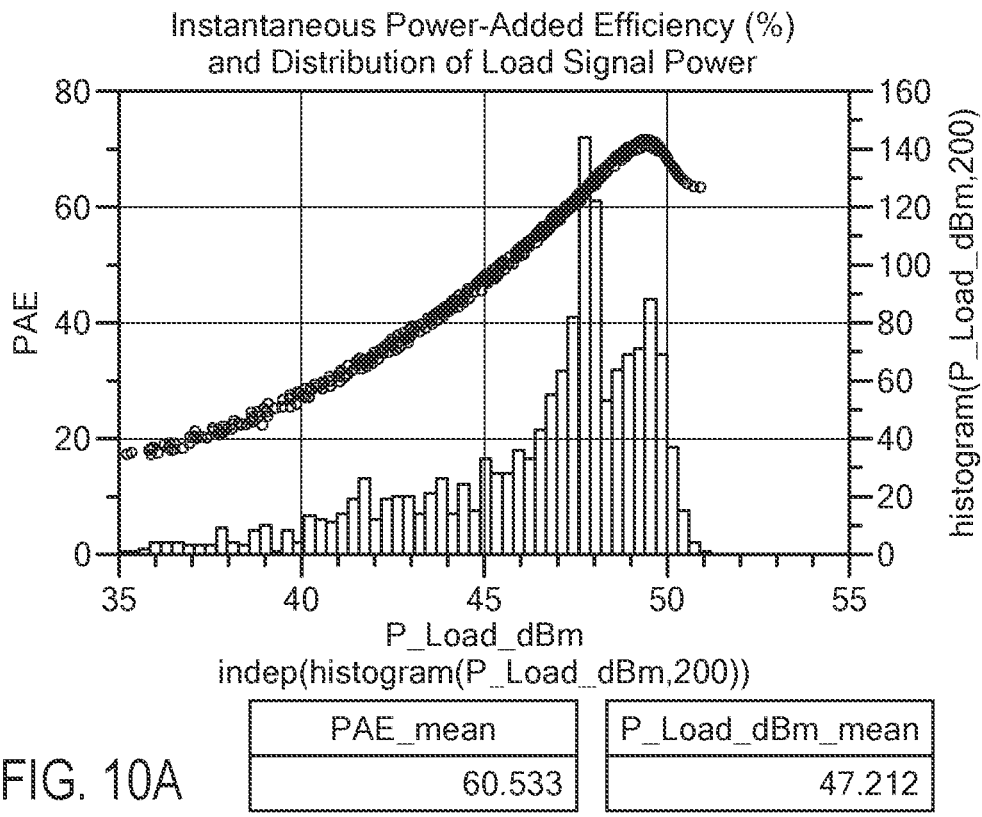
FIGS. 10A-10D show the characteristics of the simulated design example under the input signal shown in FIG. 9.
Figure 10B:
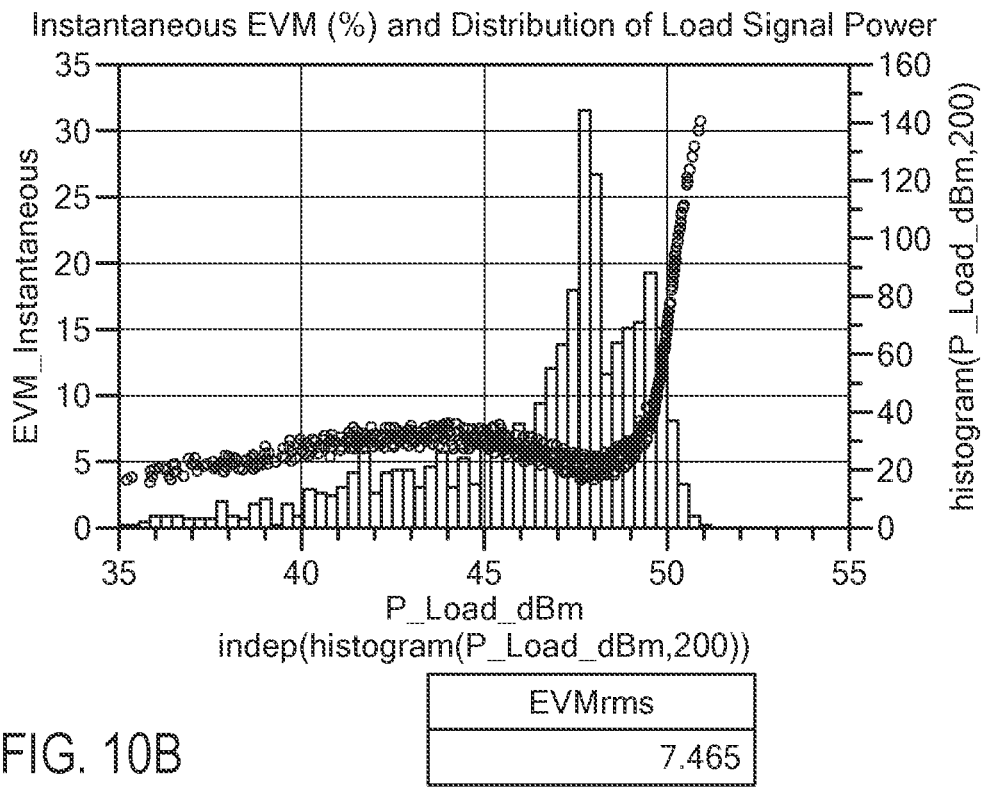
Figure 10C:
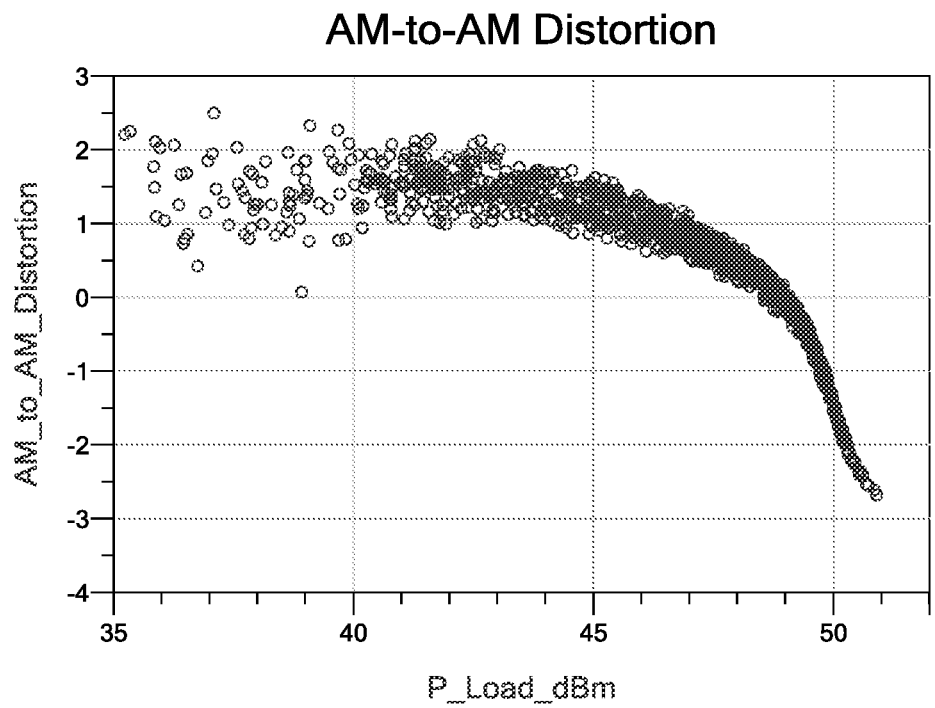
Figure 10D:
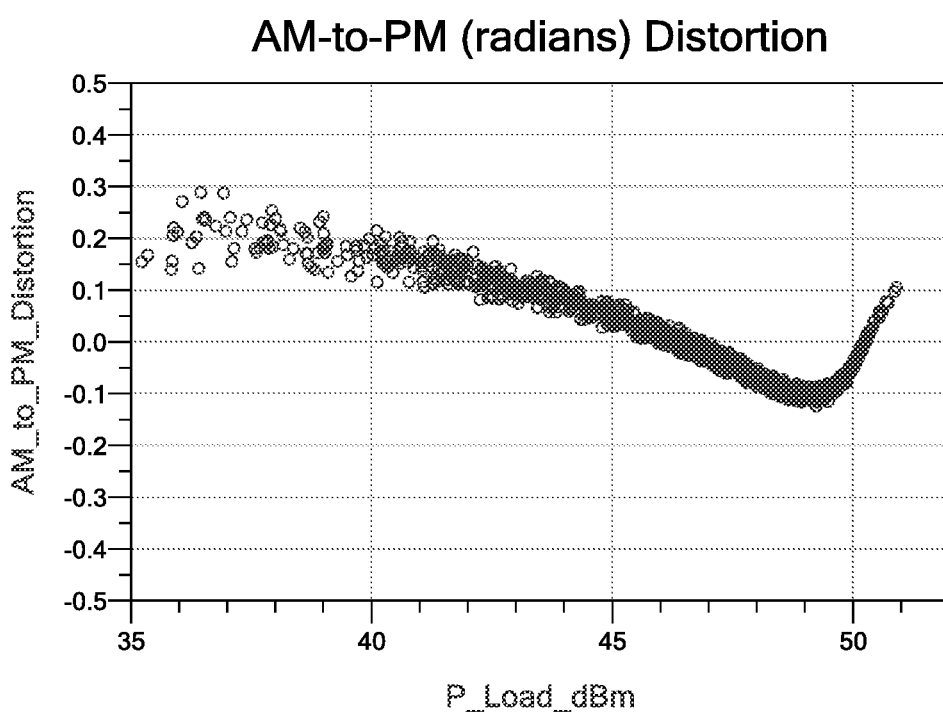

FIGS. 10A-10D show the characteristics of the simulated design example under the input signal shown in FIG. 9. In FIGS. 10A-10B, the histogram shows the distribution of the load signal power, the curve of FIG. 10A shows the instantaneous PAE, and the curve of FIG. 10B shows the instantaneous error vector magnitude (EVM). It can be seen that the behaviors of the PAE and EVM match the highest probability of power distribution function (PDF) of high PAPR signal applied. FIGS. 10C and 10D show the amplitude-to-amplitude conversion (AM-AM) distortions and amplitude-to-phase conversion (AM-PM) distortions as a function of the load signal power, respectively. It can be seen that this embodiment is suitable for digital pre-distortion (DPD) compensation.

Figure 11:
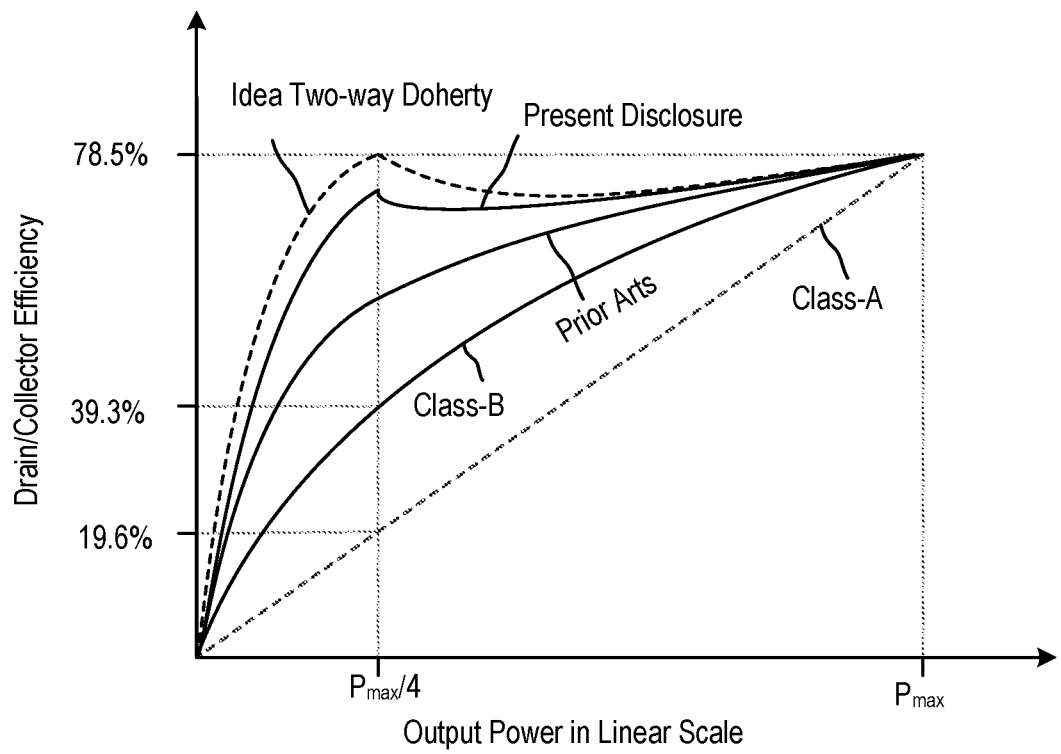
FIG. 11 shows the efficiency curves of different Doherty PAs.

FIG. 11 shows the efficiency curves of different Doherty PAs. As shown, due to the increased peaking off-state impedance, the drain efficiency of the carrier/main amplifier in the design example of the present disclosure is more approaching to the value in ideal case.

Figure 12:
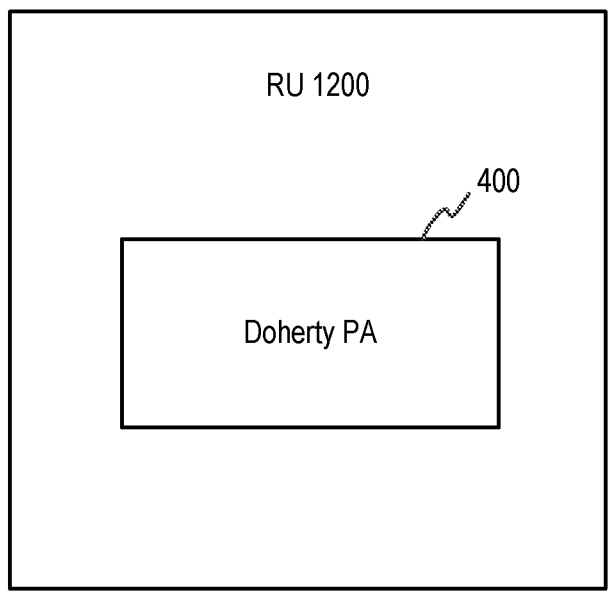
FIG. 12 is a block diagram showing a radio unit according to an embodiment of the disclosure.

FIG. 12 is a block diagram showing a radio unit (RU) according to an embodiment of the disclosure. As shown, the RU 1200 includes the Doherty PA 400 described above. As an example, the RU 1200 may be a remote radio unit (RRU) of a base station. As another example, the RU 1200 may be used for a terminal device such as a mobile phone. The other configurations of the RU for the base station or the terminal device may be well known to those skilled in the art, and thus the detailed description thereof is omitted here.

Figure 13:
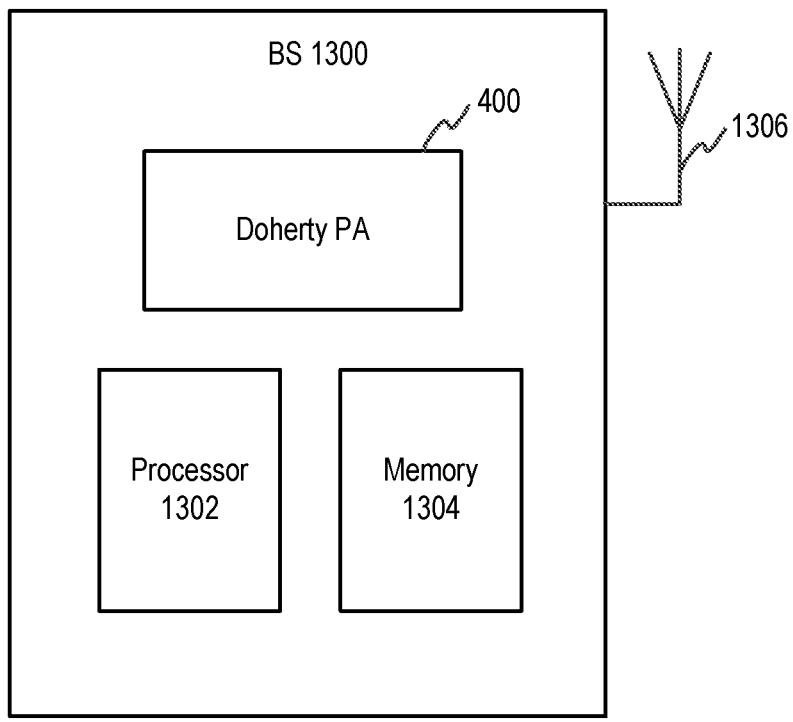
FIG. 13 is a block diagram showing a base station according to an embodiment of the disclosure.

FIG. 13 is a block diagram showing a base station (BS) according to an embodiment of the disclosure. As shown, the BS 1300 (e.g., an evolved Node B simply referred to as eNB) comprises a processor 1302, a memory 1304, the Doherty PA 400 described above and an antenna unit 1306. The memory 1304 contains instructions executable by the processor 1302 to implement various functions of the BS 1300. The power amplifier 400 is configured to amplify an RF signal. The antenna unit 1306 is configured to transmit the amplified RF signal.

Figure 14:
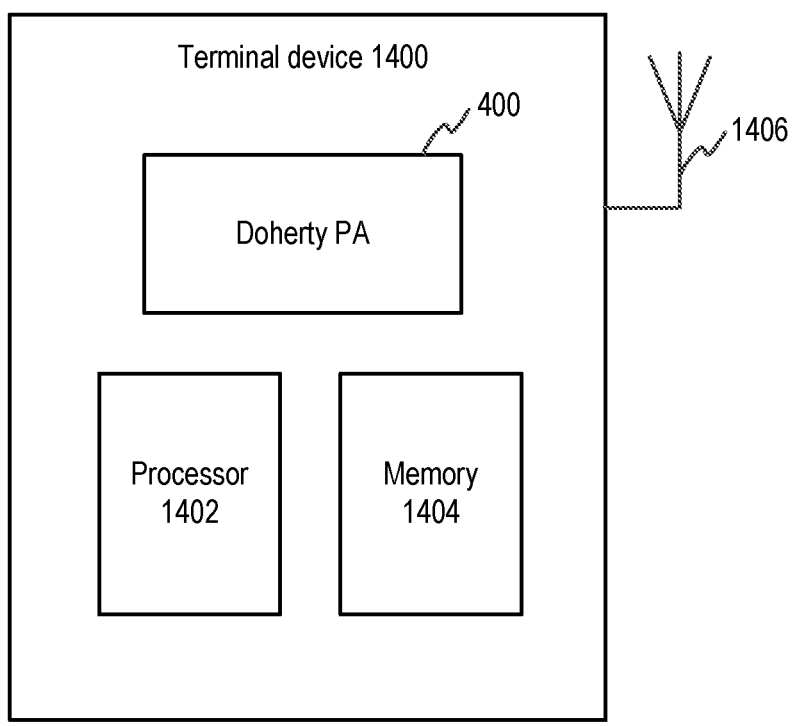
FIG. 14 is a block diagram showing a terminal device according to an embodiment of the disclosure.

FIG. 14 is a block diagram showing a terminal device according to an embodiment of the disclosure. The term "terminal device" refers to any end device that can access a wireless communication network and receive services therefrom. By way of example and not limitation, the terminal device refers to a mobile terminal, user equipment (UE), or other suitable device. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like.

As shown, the terminal device 1400 comprises a processor 1402, a memory 1404, the Doherty PA 400 described above and an antenna unit 1406. The memory 1404 contains instructions executable by the processor 1402 to implement various functions of the terminal device 1400. The power amplifier 400 is configured to amplify an RF signal. The antenna unit 1406 is configured to transmit the amplified RF signal.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A power amplifier comprising:
a splitter network configured to split an input signal into a carrier input signal and a peaking input signal;
a carrier amplifier path comprising at least a carrier amplifier configured to amplify the carrier input signal and carrier input and output matching networks;
a peaking amplifier path combined at a junction node with the carrier amplifier path and comprising at least a peaking amplifier configured to amplify the peaking input signal and peaking input and output matching networks;
the peaking amplifier path further comprising a first impedance transformer coupled between an output of the peaking output matching network and the junction node to enhance the off-state impedance of the peaking amplifier;
the carrier amplifier path further comprises a second impedance transformer coupled between an output of the carrier output matching network and the junction node;
at least one of the first impedance transformer and the second impedance transformer is configured to transform an impedance into another impedance;
the another impedance being determined based on at least one of a characteristic of the carrier amplifier and a characteristic of peaking amplifier;
the first impedance transformer is configured to transform a first output impedance seen from the output of the peaking output matching network into a second output impedance seen from an output of the first impedance transformer, the second output impedance being higher than the first output impedance;
the second impedance transformer is configured to transform a third output impedance seen from the output of the carrier output matching network into a fourth output impedance seen from an output of the second impedance transformer; and
the parallel impedance of the second and fourth output impedances equals to a junction node impedance of the power amplifier.

2. The power amplifier according to claim 1, wherein saturation output power ratio between the peaking amplifier and the carrier amplifier is equal to or greater than one.

3. The power amplifier according to claim 2, wherein the first impedance transformer is configured to transform a first output impedance seen from the output of the peaking output matching network into a second output impedance seen from an output of the first impedance transformer, the second output impedance being higher than the first output impedance;
wherein the second impedance transformer is configured to transform a third output impedance seen from the output of the carrier output matching network into a fourth output impedance seen from an output of the second impedance transformer; and
wherein the parallel impedance of the second and fourth output impedances equals to a junction node impedance of the power amplifier in both a high-power mode where both the carrier and peaking amplifiers turn on and a low-power mode where only the carrier amplifier turns on, and the junction node impedance equals to the system load impedance of the power amplifier.

4. The power amplifier according to claim 3, wherein when the power amplifier operates in the low-power mode where the peaking amplifier is turned off, the second output impedance equals to the first output impedance multiplied by at least a product of voltage standing wave ratio (VSWR) and r, where r is the saturation output power ratio between the peaking amplifier and the carrier amplifier, and VSWR=r+1.

5. The power amplifier according to claim 4, wherein when the power amplifier operates in the high-power mode, the first output impedance equals to $Z0/r$, the second output impedance equals to $Z0*VSWR$, the third output impedance equals to $Z0$, and the fourth output impedance equals to $Z0*VSWR*r$, where $Z0$ equals to $ZL/r$ and $ZL$ is the system impedance of the power amplifier; and
wherein when the power amplifier operates in the low-power mode, the third output impedance equals to $Z0*VSWR$, and the fourth output impedance equals to $Z0*r$.

6. The power amplifier according to claim 5, wherein the carrier amplifier path is configured to have low impedance transformation ratios in both the high-power mode and the low-power mode to expand bandwidth.

7. The power amplifier according to claim 1, wherein the splitter network is configured to split the power of the input signal in an imbalanced manner to assign more power to the peaking amplifier path and assign less power to the carrier amplifier path.

8. The power amplifier according to claim 7, wherein the splitter network is one of: an in-phase power divider or a directional coupler.

9. The power amplifier according to claim 1, wherein an offset line is disposed either in the carrier amplifier path before the carrier input matching network, or in the peaking amplifier path before the peaking input matching network.

10. The power amplifier according to claim 1, wherein the first impedance transformer is disposed partially within the peaking output matching network.

11. The power amplifier according to claim 1, wherein the power amplifier is comprised in a radio unit (RU).

12. The power amplifier according to claim 1, wherein
the first impedance transformer is configured to transform a first impedance into a second impedance,
the second impedance transformer is configured to transform a third impedance into a fourth impedance, and
each of the second impedance and the fourth impedance is determined based on at least one of a characteristic of the carrier amplifier and a characteristic of peaking amplifier.

13. The power amplifier according to claim 12, wherein
the characteristic of the carrier amplifier is saturation output power of the carrier amplifier, and
the characteristic of the peaking amplifier is saturation output power of the peaking amplifier.

14. The power amplifier according to claim 13, wherein each of the second impedance and the fourth impedance is determined based on saturation output power ratio between the peaking amplifier and the carrier amplifier.

15. The power amplifier according to claim 1, wherein
when the power amplifier operates in a first power mode, both the carrier and peaking amplifiers are configured to be turned on, and
when the power amplifier operates in a second power mode, only the carrier amplifier is configured to be turned on.

16. A base station comprising:
a processor;
a memory, the memory containing instructions executable by the processor to implement functions of the base station;
a power amplifier, the power amplifier being configured to amplify a radio frequency (RF) signal, the power amplifier comprising:
  a splitter network configured to split an input signal into a carrier input signal and a peaking input signal;
  a carrier amplifier path comprising at least a carrier amplifier configured to amplify the carrier input signal and carrier input and output matching networks;
  a peaking amplifier path combined at a junction node with the carrier amplifier path and comprising at least a peaking amplifier configured to amplify the peaking input signal and peaking input and output matching networks;
  the peaking amplifier path further comprising a first impedance transformer coupled between an output of the peaking output matching network and the junction node to enhance the off-state impedance of the peaking amplifier;
  the carrier amplifier path further comprises a second impedance transformer coupled between an output of the carrier output matching network and the junction node;
  at least one of the first impedance transformer and the second impedance transformer is configured to transform an impedance into another impedance;
  the another impedance being determined based on at least one of a characteristic of the carrier amplifier and a characteristic of peaking amplifier;
  the first impedance transformer is configured to transform a first output impedance seen from the output of the peaking output matching network into a second output impedance seen from an output of the first impedance transformer, the second output impedance being higher than the first output impedance;
  the second impedance transformer is configured to transform a third output impedance seen from the output of the carrier output matching network into a fourth output impedance seen from an output of the second impedance transformer; and
  the parallel impedance of the second and fourth output impedances equals to a junction node impedance of the power amplifier; and
an antenna unit configured to transmit the amplified RF signal.

17. A terminal device comprising:
a processor;
a memory, the memory containing instructions executable by the processor to implement functions of the terminal device;
a power amplifier, the power amplifier being configured to amplify a radio frequency (RF) signal, the power amplifier comprising:
  a splitter network configured to split an input signal into a carrier input signal and a peaking input signal;
  a carrier amplifier path comprising at least a carrier amplifier configured to amplify the carrier input signal and carrier input and output matching networks;
  a peaking amplifier path combined at a junction node with the carrier amplifier path and comprising at least a peaking amplifier configured to amplify the peaking input signal and peaking input and output matching networks;
  the peaking amplifier path further comprising a first impedance transformer coupled between an output of the peaking output matching network and the junction node to enhance the off-state impedance of the peaking amplifier;
  the carrier amplifier path further comprises a second impedance transformer coupled between an output of the carrier output matching network and the junction node;
  at least one of the first impedance transformer and the second impedance transformer is configured to transform an impedance into another impedance;
  the another impedance being determined based on at least one of a characteristic of the carrier amplifier and a characteristic of peaking amplifier;
  the first impedance transformer is configured to transform a first output impedance seen from the output of the peaking output matching network into a second output impedance seen from an output of the first impedance transformer, the second output impedance being higher than the first output impedance;
  the second impedance transformer is configured to transform a third output impedance seen from the output of the carrier output matching network into a fourth output impedance seen from an output of the second impedance transformer; and
  the parallel impedance of the second and fourth output impedances equals to a junction node impedance of the power amplifier; and
an antenna unit configured to transmit the amplified RF signal.

* * * * *